United States Patent
Bleeker et al.

(10) Patent No.: US 6,876,440 B1
(45) Date of Patent: Apr. 5, 2005

(54) METHODS AND SYSTEMS TO COMPENSATE FOR A STITCHING DISTURBANCE OF A PRINTED PATTERN IN A MASKLESS LITHOGRAPHY SYSTEM UTILIZING OVERLAP OF EXPOSURE ZONES WITH ATTENUATION OF THE AERIAL IMAGE IN THE OVERLAP REGION

(75) Inventors: Arno Bleeker, Westerhoven (NL); Wenceslao A. Cebuhar, Norwalk, CT (US); Justin Kreuzer, Trumbull, CT (US); Azat Latypov, Danbury, CT (US); Yuli Vladimirsky, Weston, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 10/674,070

(22) Filed: Sep. 30, 2003

(51) Int. Cl.[7] .......................... G03B 27/32; G03B 27/68
(52) U.S. Cl. ........................................ 355/77; 355/52
(58) Field of Search ............................. 355/53, 67–71, 355/52, 55, 77; 359/224, 855; 356/237.1; 430/5, 20, 30

(56) References Cited

U.S. PATENT DOCUMENTS

| | | | | |
|---|---|---|---|---|
| 5,691,541 A | * | 11/1997 | Ceglio et al. | 250/492.1 |
| 6,312,134 B1 | * | 11/2001 | Jain et al. | 359/855 |
| 6,498,685 B1 | * | 12/2002 | Johnson | 359/626 |
| 2003/0030781 A1 | * | 2/2003 | Bleeker et al. | 355/67 |
| 2004/0053143 A1 | * | 3/2004 | Sandstrom | 430/5 |

* cited by examiner

*Primary Examiner*—Henry Hung Nguyen
(74) *Attorney, Agent, or Firm*—Sterne, Kessler, Goldstein & Fox PLLC

(57) ABSTRACT

A method and system are provided for printing a pattern on a photosensitive surface using a spatial light modulator (SLM). An exemplary method includes defining two or more exposure areas on the photosensitive surface, the exposure areas overlapping along respective edge portions of the exposure areas to form an overlap zone therebetween. Two or more exposure areas are exposed to print an image therein, the exposing extending through the overlap zone. The exposing within the overlap zone is then attenuated.

15 Claims, 13 Drawing Sheets

METHODS AND SYSTEMS TO COMPENSATE FOR A STITCHING DISTURBANCE OF A PRINTED PATTERN IN A MASKLESS LITHOGRAPHY SYSTEM UTILIZING OVERLAP OF EXPOSURE ZONES WITH ATTENUATION OF THE AERIAL IMAGE IN THE OVERLAP REGION

BACKGROUND OF THE INVENTION

1. Field of the Invention

The present invention generally relates to printing patterns on photosensitive surfaces.

2. Related Art

A printed pattern in a generic, maskless lithography tool is formed from a sequence of exposures, or shots. Each shot results from an image of a spatial light modulator (SLM) array being projected onto the surface of a photosensitive surface, such as a wafer substrate. This results in deposition of a dose, or a quantity of irradiation from a light source, within a certain exposure zone on this surface. Exposure zones are created when the substrate surface is illuminated by flashes of light from the light source. When the pattern extends beyond the boundaries of exposures of a single SLM, the exposures are stitched together along adjacent boundaries to form a completed pattern.

Stitching errors in the printed pattern occur near these boundaries between adjacent exposure zones due to both geometrical misalignments of the exposures and disturbances due to other optical phenomena. Generally, stitching errors occur in printed patterns due to spatial misalignment of the exposure zone on the wafer from its expected position. Optical effects may also create stitching errors, even in cases where the alignment may be perfect. Even a small spatial misalignment of the shots, in the case of a spatial misalignment, may result in a significant perturbation of the printed pattern near the stitching line.

The optical effects are due to the fact that distribution of the dose within each exposure zone is a result of an exposure by partially coherent light. Since two adjacent exposure zones are exposed at different times, the exposures are effectively incoherent, thus creating the unwanted optical effects.

Therefore, what is needed is a solution to compensate for stitching errors in printed patterns that occur near the stitching line between adjacent exposure zones.

BRIEF SUMMARY OF THE INVENTION

Consistent with the principles of the present invention as embodied and broadly described herein, the present invention includes a method and system are provided for printing a pattern on a photosensitive surface using a spatial light modulator (SLM). An exemplary method includes defining two or more exposure areas on the photosensitive surface, the exposure areas overlapping along respective edge portions of the exposure areas to form an overlap zone therebetween. Two or more exposure areas are exposed to print an image therein, the exposing extending through the overlap zone. The exposing within the overlap zone is then attenuated.

Further features and advantages of the present invention, as well as the structure and operation of various embodiments of the present invention, are described in detail below with reference to the accompanying drawings.

DESCRIPTION OF THE FIGURES/DRAWINGS

The accompanying drawings, which are incorporated in and constitute part of the specification, illustrate embodiments of the invention and, together with the general description given above and detailed description given below, serve to explain the principles of the invention. In the drawings.

DETAILED DESCRIPTION OF THE INVENTION

Figure 1:
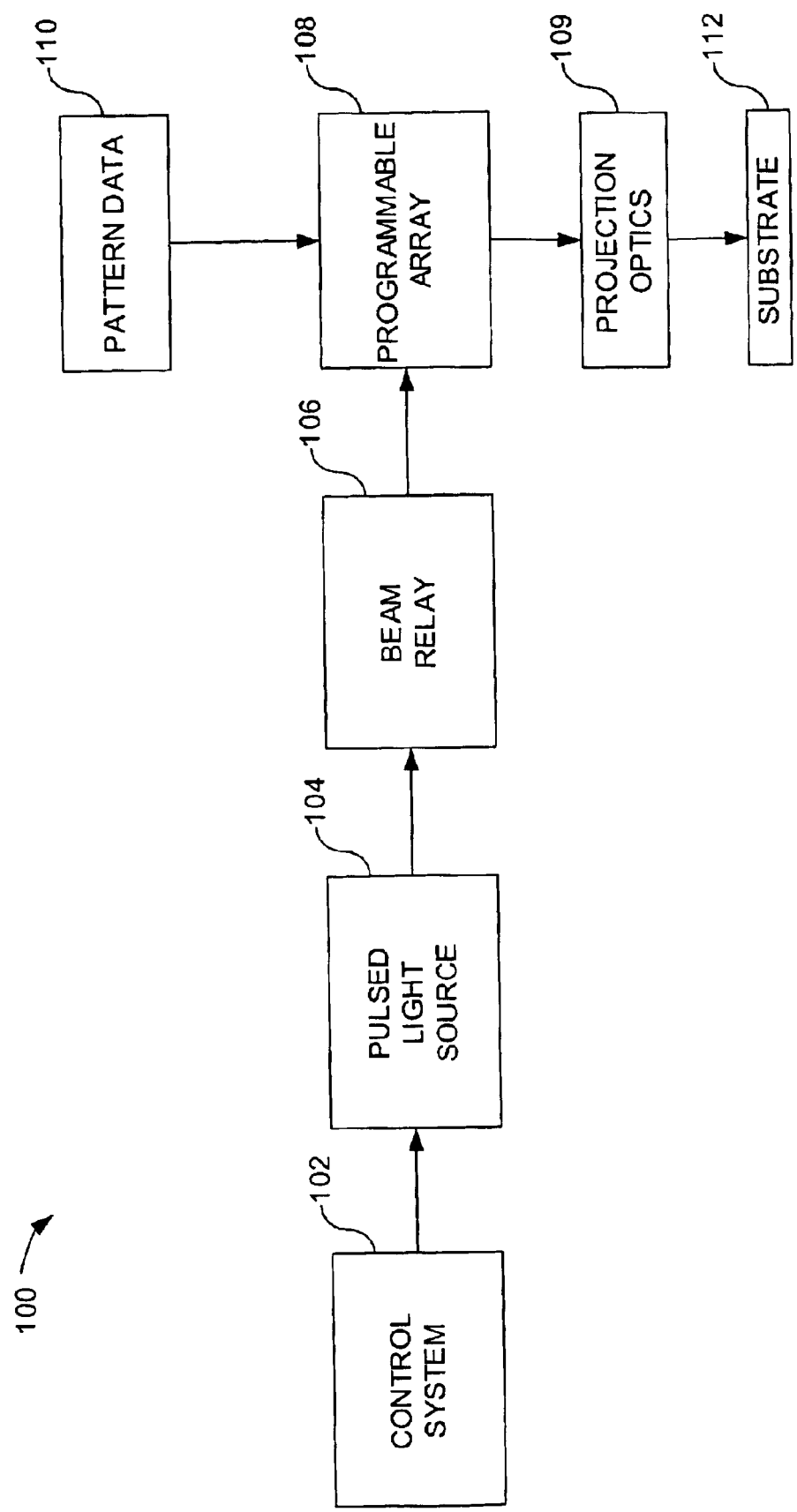
FIG. 1 is a block diagram illustration of a maskless lithography system structured and arranged in accordance with an embodiment of the present invention.

The following detailed description of the present invention refers to the accompanying drawings that illustrate exemplary embodiments consistent with this invention. Other embodiments are possible, and modifications may be made to the embodiments within the spirit and scope of the invention. Therefore, the following detailed description is not meant to limit the invention. Rather, the scope of the invention is defined by the appended claims.

It would be apparent to one skilled in the art that the present invention, as described below, may be implemented in many different embodiments of hardware, software, firmware, and/or the entities illustrated in the drawings. Any actual software code with the specialized, controlled hardware to implement the present invention is not limiting of the present invention. Thus, the operation and behavior of the present invention will be described with the understanding that modifications and variations of the embodiments are possible, given the level of detail presented herein.

FIG. 1 is a block diagram view of a maskless lithography system arranged in accordance with an embodiment of the present invention. In FIG. 1, a maskless lithography system 100 includes a control system 102. The control system 102 includes a computer processor, a memory, and a user interface configured to enable a user to input data for instructing the maskless lithography system 100 to produce a printed pattern.

The control system 102 is coupled to a pulsed light source 104 which provides pulses of light from a light source, such as an excimer laser or some other suitable pulsed illumination mechanism. The pulsed light source 104 is coupled to a beam relay system 106 which is typically an anomorphic system that includes a series of lenses to create a desired numerical aperture in the light beam produced by the pulsed light source 104. The pulsed light output from the beam relay 106 is imaged onto a programmable array 108.

The programmable array 108 is configured to receive image pattern data 110, representative of a desirable lithographic pattern, and reflect light representative of the image to a projection optics (PO) 109. The pattern data 110 is also known in the art as mask layout data. The light reflected from programmable array 108 passes through the PO 109 and then falls onto the substrate 112. The function of the Projection Optics is (1) to form an image of the object on the substrate and (2) to reduce the image compared to the dimensions of the object. A pattern, representative of the image data 110, is then imaged onto a photosensitive surface 112, such as a wafer substrate, which is being scanned at a constant velocity. As understood by those of skill in the art, the images that are to be projected onto the photosensitive surface 112 are contained in the programmable array 108 and may be changed by a user via the control system 102.

The programmable array 108 can include an SLM, or some other suitable micro-mirror array. By way of background, an SLM is an array composed of a multitude of individually controlled pixels (otherwise referred to as SLM elements). Each pixel can change its optical properties in a controllable manner so that the field in the object plane can be modulated. A typical SLM has square pixels arranged in a rectangular array, with each pixel having an ability to change only one of the parameters characterizing its optical properties (one-parametric local modulation) within a certain range.

For example, an existing SLM has 16×16 mm$^2$ tilting mirrors arranged in a 2040×512 array and running at a 1 KHz refresh rate. The light modulation principles implemented in different SLMs can be classified as transmittance modulation, modulation by light deflection, phase shift modulation, de-focus modulation, and/or a combination of several of the aforementioned modulation types.

Figure 2:
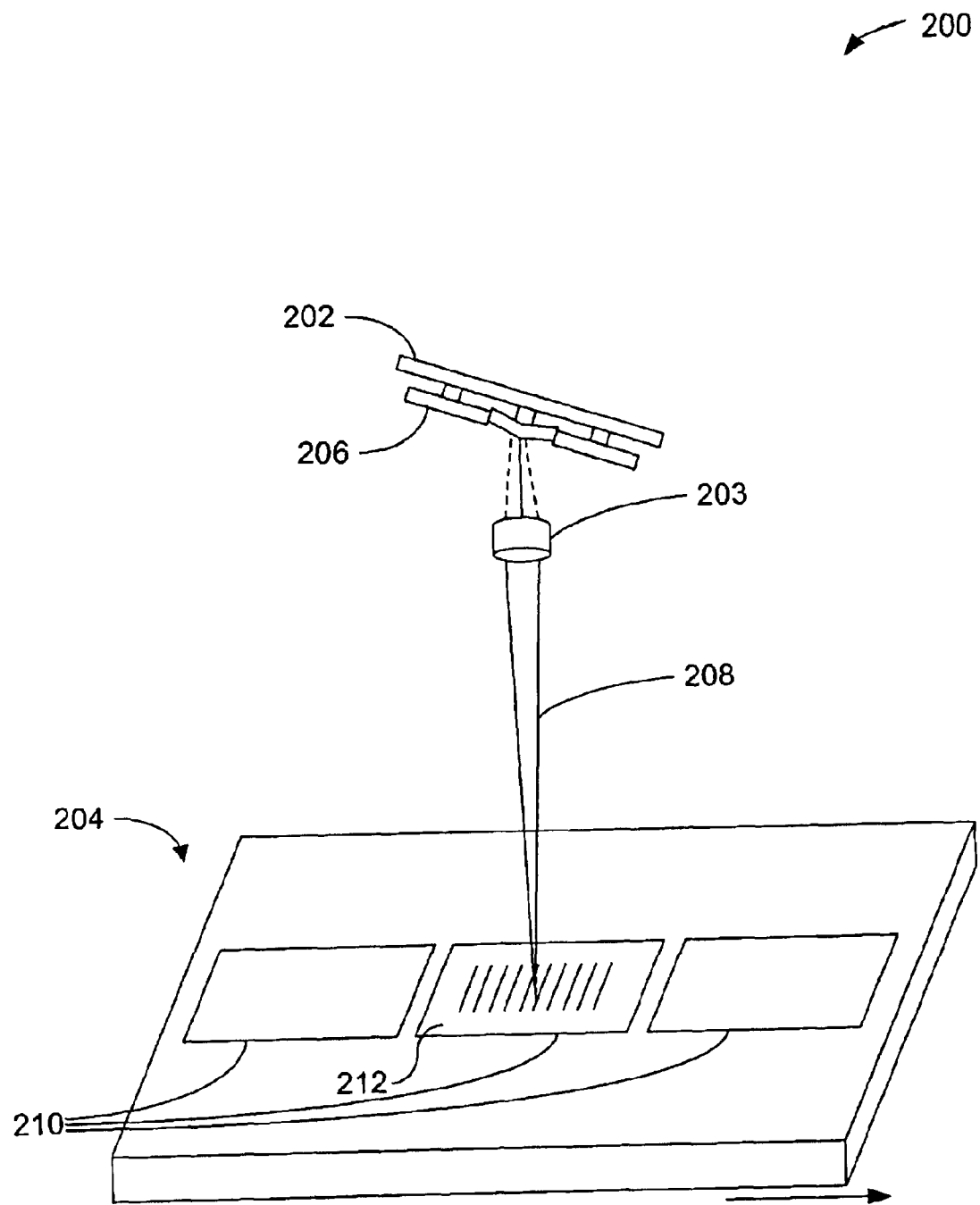
FIG. 2 is a diagrammatic perspective view of the exposure of a photosensitive surface.

FIG. 2 is a diagrammatic perspective view of more detailed aspects a maskless lithography system, such as the system 100 of FIG. 1. In FIG. 2, a system 200 includes an SLM 202, a PO 203, and a substrate 204 having a photosensitive surface. The SLM 202 includes mirror elements 206 configured to reflect light pulses 208 onto the substrate 204 within two-dimensional exposure regions 210. The light pulses 208 are used to form a pattern 212 within the exposure regions 210.

By way of background, the printed pattern in a maskless lithography tool is formed from a sequence of two-dimensional exposures or shots. Each of these two-dimensional shots results from an image of a single SLM being projected to the surface of the wafer, and it results in deposition of a dose within a certain exposure zone. Additionally, each exposure is created by a single pulse of light from the pulsed light source. Since the two-dimensional exposure zones are stitched together edge-to-edge, the stitching is very critical. A displacement of one exposure zone on the order of a few nanometers can create pattern errors along the edge that are clearly visible and detrimental to features within the pattern. A single exposure can be performed in several passes over a substrate surface, as illustrated in FIG. 3.

Figure 3:
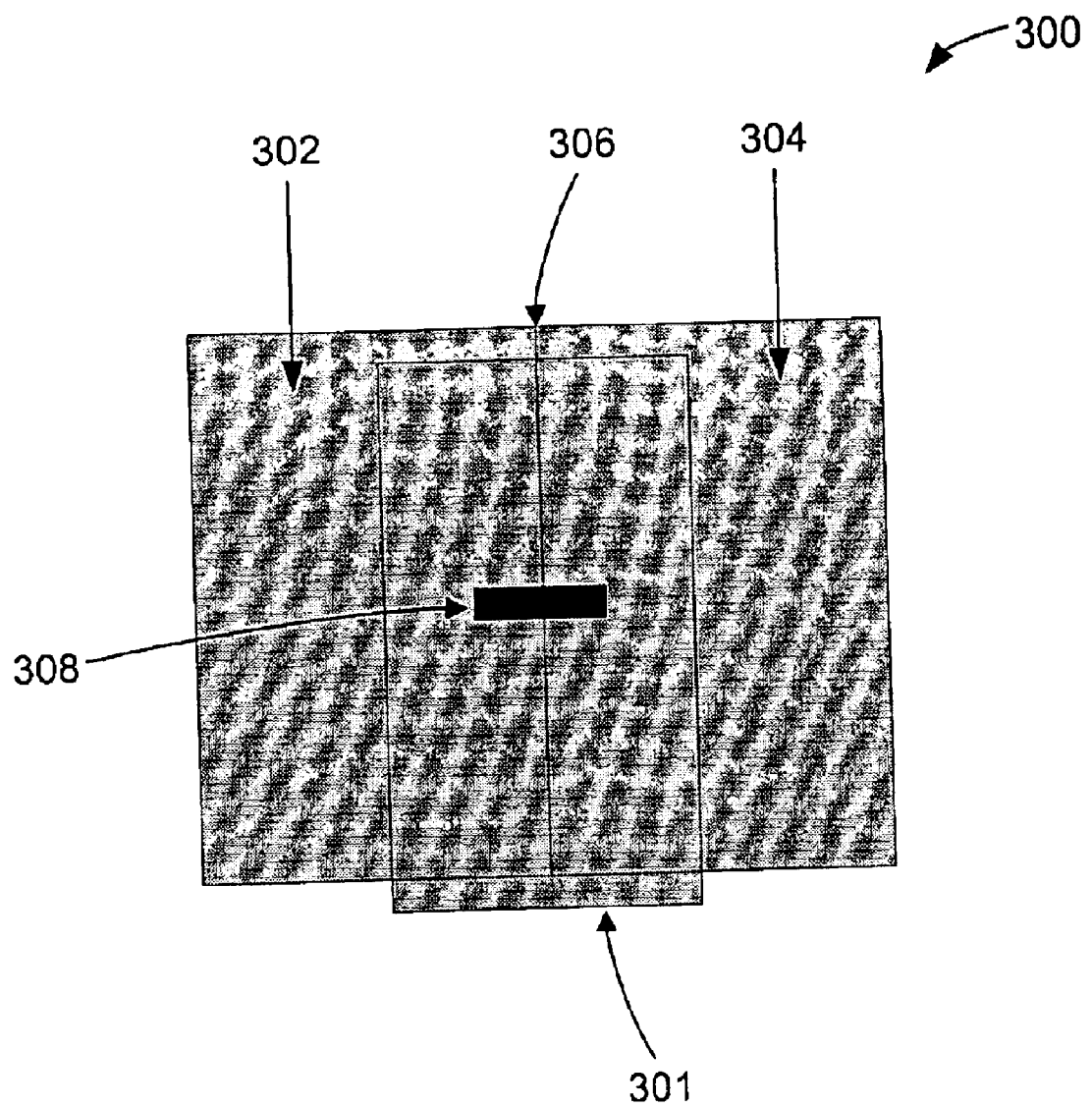
FIG. 3 is an illustration of deposition of a dose within a number of exposure zones.

FIG. 3 is an illustration of the formation of a pattern feature that extends across the boundary, or stitching line, of adjacent exposure zones. In FIG. 3, stitched exposure zones 300 include exposure zones 301, 302, and 304. Each of these exposure zones is created through deposition of a dose on a photosensitive surface produced by a single light pulse from an illumination source, such as the pulsed light source 104 of FIG. 1. That is, within the duration of a single pulse, a photosensitive surface, such as the substrate 204, is moved a predetermined distance resulting in the deposition of the dose within each of the zones 301, 302, and 304.

An adjacent boundary of exposure zones 302 and 304 forms a stitching line 306. A pattern feature 308 is formed within the exposure zones 301, 302, and 304 and is positioned across the stitching line 306. Optical effects or distortions of the feature 308 can occur due to the fact that distribution of a dose within each exposure zone is the result of an exposure by a partially coherent light. Subsequently, since the two adjacent exposure zones 302 and 304 are exposed at different times, these exposure zones are effectively incoherent.

Figure 4:
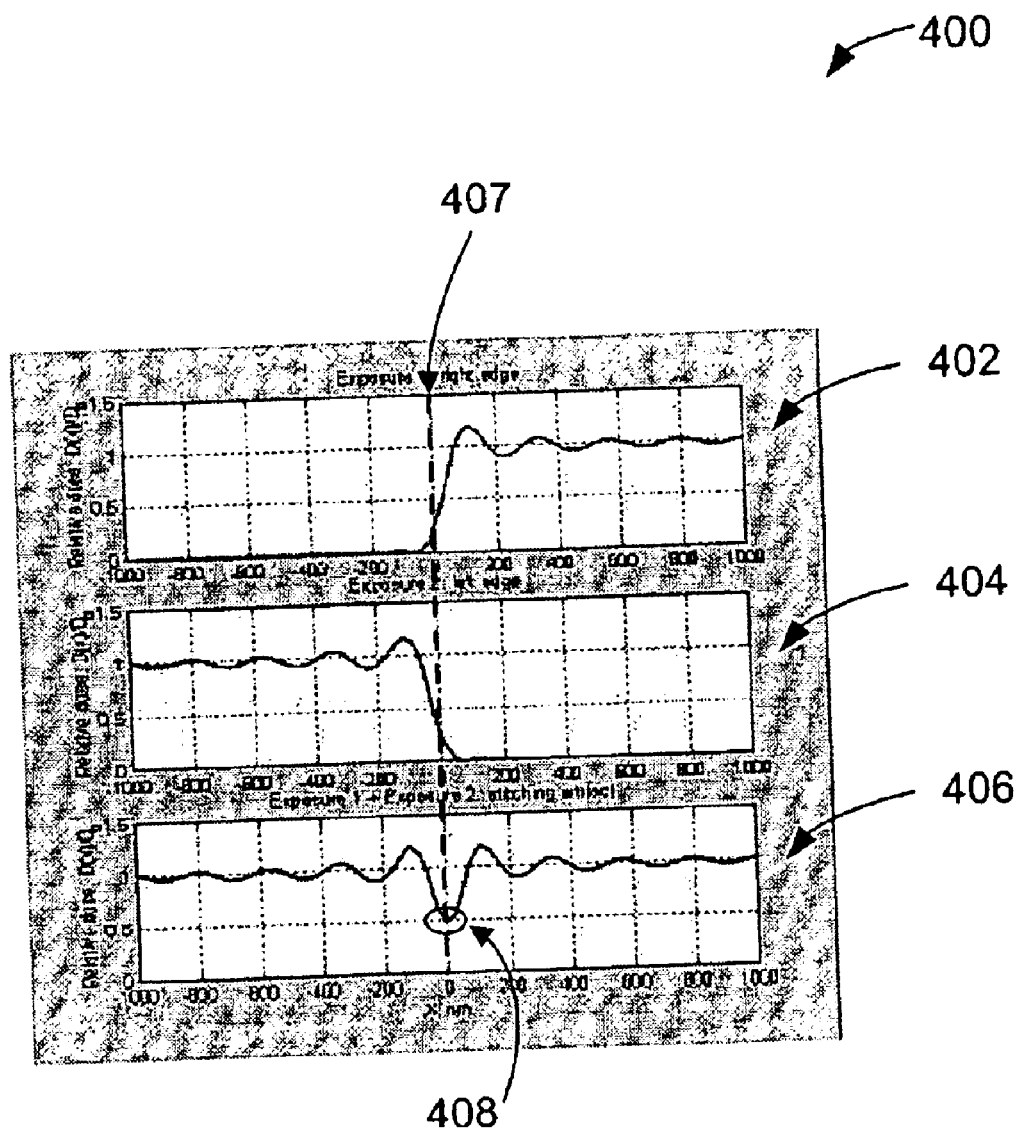
FIG. 4 is a graphical illustration of a stitching disturbance near the stitching line in a desired uniform pattern.

FIG. 4 is a graphical illustration of a stitching disturbance near a stitching line in the desired uniform pattern in a scenario where coherent illumination is assumed. For purposes of illustration, examples of coherent illumination are used because coherent illumination is considered to produce the most significant stitching errors (disturbances) in printed patterns. The present invention, however, is not limited to such an application.

In FIG. 4, a graph 400 illustrates that a uniformly bright field is imaged in two exposures stitched at the origin. A first exposure 402 results from the pixels to the right of the origin in the object plane set to their absolutely bright state, while the object plane field to the left from the origin is zero. The resulting relative intensity distribution, or relative dose variation, in the image plane is a well-known diffraction-limited image of a semi-plane.

A second exposure 404 is a mirror image of the exposure 402 with respect to the origin. One can readily observe that the relative dose value (or relative image intensity) at the origin for both exposures is (¼) for the case of coherent illumination. A combination of the right-edge exposure 402 and the left-edge exposure 404 produces an exposure 406 having a relative local-dose value of (½) along a stitching boundary 407. The combination of the exposures at the stitching line 407 with the relative local dose value of (½) forms a stitching artifact or error 408.

In a practical sense, stitching artifacts, such as the stitching artifact 408, will disturb the morphology of features (e.g, the feature 308 of FIG. 3) that are formed across stitching boundaries, such as the boundary 407. One such morphology disturbance is the occurrence of variations in the line width of lines used to form the printed patterns.

Figure 5:
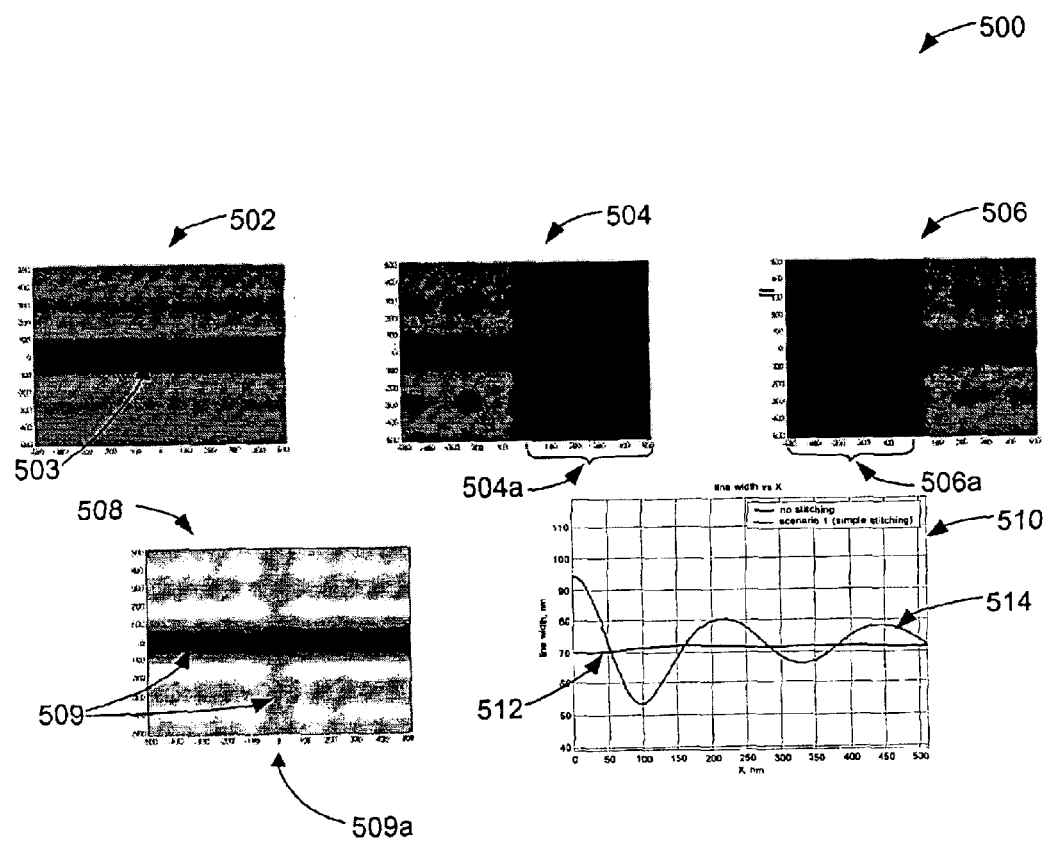
FIG. 5 is an illustration of the effects of a stitching disturbance of an isolated dark line.

FIG. 5 is an illustration of the impact stitching errors can have upon line-width variation in the absence of stitching-error compensation techniques. More specifically, FIG. 5 is an illustration of a test case showing the stitching disturbance of an isolated dark line. In FIG. 5, an exemplary exposure 502 includes an isolated horizontal dark line 503 on a bright background which is approximately 2000 nanometers (nm) long (~9λ/NA), where (λ) is the light wavelength and (NA) is the numerical aperture. The horizontal dark line 503 is formed using tilting mirror pixels in the object plane.

In the example of FIG. 5, a size of each pixel, scaled to the image plane, can be determined by the expression:

$$M*L=40\ nm,$$

where (M) is the magnification factor and (L) is the pixel length

The line 503 is formed by two adjacent horizontal arrays (rows) of mirrors tilted by $$\left(\alpha_0 = \frac{\lambda'}{2*L}\right)$$

and $(-\alpha_0)$, respectively, where $(\alpha)$ is the tilt angle. The pixels of these rows act almost as absolutely dark pixels. The background is bright and is formed by the pixels with their mirrors being flat.

The pattern that forms the line 503 is exposed in three exposures: 502, 504, and 506, in the manner illustrated in FIG. 3 above. The exposure 502 occurs during the first pass of the substrate, and it exposes the entire line 503. The exposures 504 and 506 are two consecutive exposures during a second pass of the substrate. Each of the two exposures 504 and 506 respectively exposes one-half of the dark line 503. Dose distributions 504a and 506a, respectively associated with the exposures 504 and 506, are shown near a stitching line resulting from each of the three exposures. A sum 508 of the three exposures 502, 504, and 506 is shown and includes an under-exposure area 509 along a stitching line 509a.

A graph 510 provides an illustration of variations in the line width near the stitching line 509a. In the example of FIG. 5, the line width was computed using an image intensity threshold resulting in a 70 nm line 512. As illustrated in the graph 510, the variation, indicated by a line 514, reaches as high as +25 nm.

Although stitching errors can create anomalies that significantly degrade printed patterns, as illustrated in the examples of FIGS. 4 and 5, the present invention provides several techniques to compensate for the effects created by these stitching errors.

Stitching Compensation without Utilizing Overlap

Figure 6:
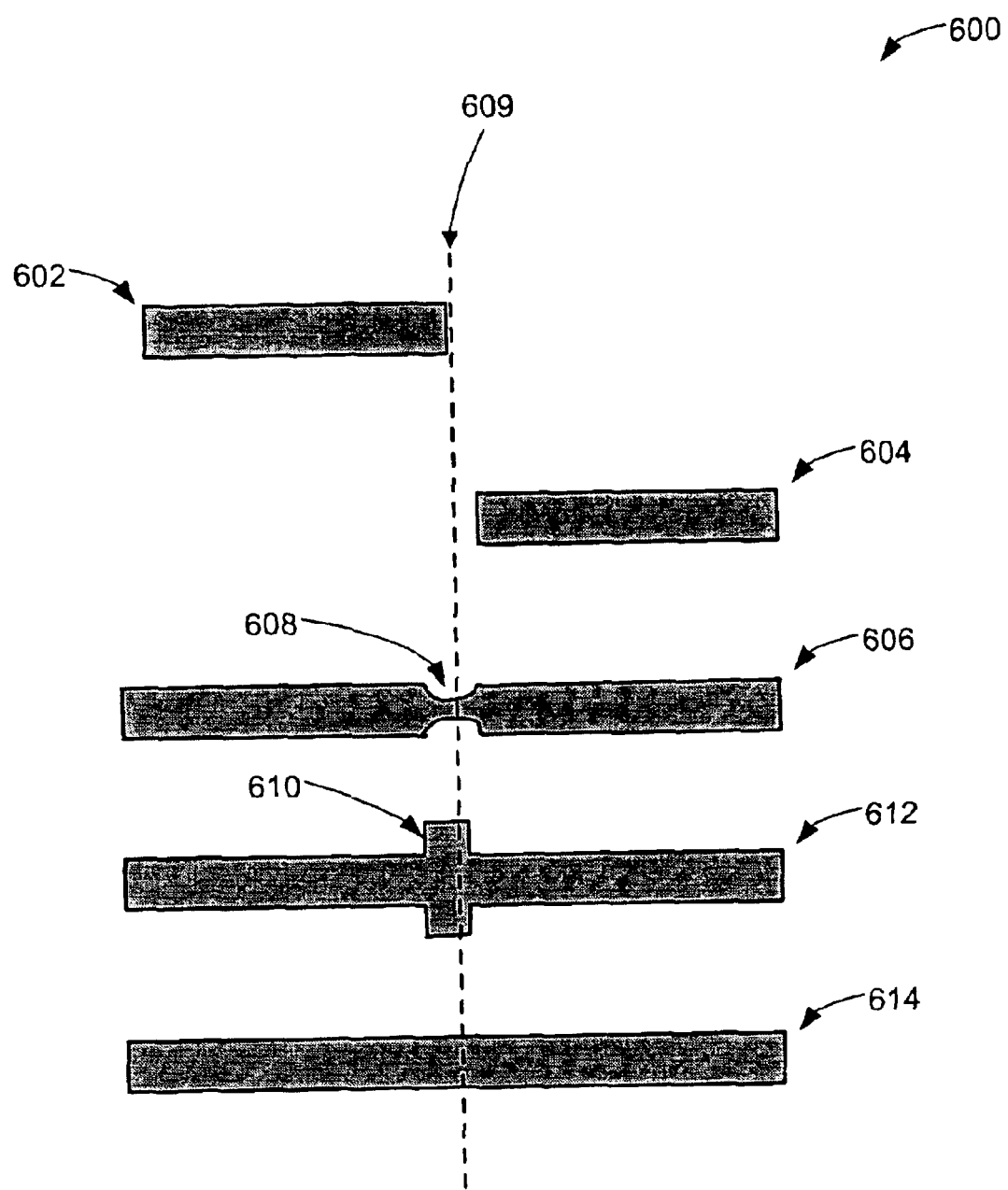
FIG. 6 is an illustration of an exemplary technique to compensate for stitching errors not utilizing overlap of the exposure zones.

FIG. 6 provides an illustration of an exemplary technique 600 to compensate for the effects of stitching errors. More specifically, the technique of FIG. 6 provides stitching error compensation without utilizing overlap of exposure areas. The technique 600 permits the addition of an assist feature during the second pass of the exposure of the substrate surface. Although in the present application, the assist feature is added during the second pass, any subsequent pass can be used as long as the pass in which the assist feature is added does not have a boundary line at the same location as a feature.

The assist features are added to the mask layout or pattern data (e.g., the pattern data 110 of FIG. 1) input to the SLM to produce the printed pattern. In the case of FIG. 6, assist features are added to the pattern data in order to make the line at the second pass thicker at a same position corresponding to earlier passes to compensate for the effects of the stitching error.

In FIG. 6, a line is produced on the photosensitive surface of a substrate during a first exposure (i.e., during a single pulse of light from an illumination source). The line includes a left segment 602 and a right segment 604, both formed during the first pass. The left and right segments 602 and 604 form a line 606 having a stitching disturbance 608 (necking) across a stitching line 609. To compensate for the stitching disturbance 608, an assist feature 610 is added to the pattern data associated with production of the line 606.

During a second pass of the substrate, the assist feature 610 produces a bulge at the stitching line 609 in a line 612 formed in the object plane. Although the line 612 having the assist feature 610 is formed in the object plane, it combines with the line 606 to produce a line 614 in the image plane. The line 614 is devoid of the stitching disturbance 608. In other words, the thicker portion represented by the assist feature 610 compensates for the resulting necking, or stitching disturbance 608, from the first pass. More generally, if exposure zones of one pass are shifted with respect to exposure zones during another pass, the passes in which the feature is not affected by the stitching line can be used to compensate for the stitching disturbance that affected the feature.

During a scan, an exposure is produced in an adjacent exposure zone. That is, the wafer is scanned once and then moves to produce another exposure zone adjacent to the previous zone. A subsequent pulse arrives and a subsequent exposure zone is formed. Stitching errors occur, and can be detected, within these exposure zones. The process of detecting, or predicting, stitching errors within the exposure zones can be accomplished using several techniques known to those of skill in the art.

Furthermore, pre-printing analyses of patterns are accomplished using, for example, image modeling with the use of modeling and simulation tools. Using these or similar modeling tools, stitching error occurrences at the stitching boundaries can also be simulated. The simulations can be performed apriorily or real-time. Thus, techniques such as the technique 600 of FIG. 6 can also be performed apriorily or real-time.

Another technique to compensate for stitching errors, that does not utilize overlap of exposure areas, is active compensation. With active compensation, exposures are performed by butting (i.e., without an overlap), and states of the SLM pixels in the vicinity of the stitching line can be adjusted. That is, the SLM pixels in the vicinity of the stitching line can be selected in such a way so that stitching disturbances can be compensated for.

For example, stitching disturbances can create a widening of the printed line in the vicinity of the stitching line, as a result of under-exposure due to edge effects. Therefore, using brighter states of the SLM pixels near the stitching line can reduce the line widening effect. Thus, to compensate for widening of the printed line, the states of the four SLM pixels, adjacent to the stitching line, can be adjusted by a proportional amount. Adjustment of a small number of pixels, however, will not always be sufficient to compensate for the stitching effects. Adequate compensation can still be achieved, however, using a larger number of pixels near the stitching line with their adjusted states computed from the solution of an inverse problem.

By adding the compensating data to the pattern data (e.g., the pattern data 110), the computation of the pixel states can be adjusted in a manner such that the pixels print the desired pattern. The calculation of pixel positions is determined in a manner that takes into account positions of the stitching lines. Pixel position determination also accounts for the fact that exposure areas separated by these stitching lines are exposed in different shots. Since the exposures are in different shots, there is no coherence between the fields in these exposures. During active compensation, however, there is a partial coherence inside each exposure based upon the predetermined illumination mode.

Figure 7:
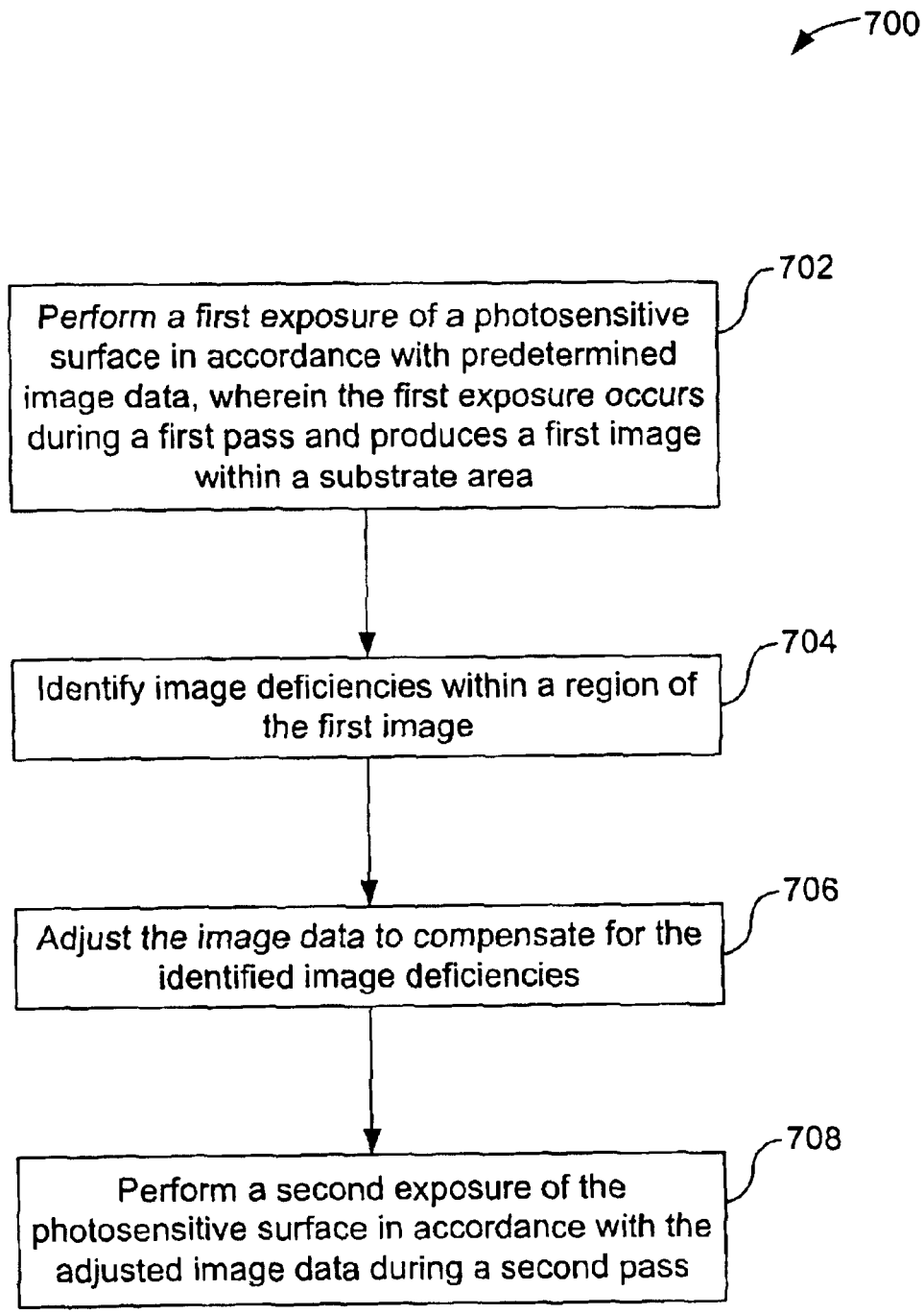
FIG. 7 is a flow diagram of an exemplary method of practicing the technique illustrated in FIG. 6.

FIG. 7 is a flow diagram of an exemplary method 700 of practicing the technique 600 of FIG. 6. In one example, method 700 is carried out by a system 200 as described above, but is not necessarily limited to this structure. In FIG. 7, a first exposure of a photosensitive surface is performed in accordance with predetermined image data (step 702). The first exposure occurs during a first pass of the substrate surface and produces a first image within a substrate area. In step 704, image deficiencies are identified within a region of the first image. The image data is adjusted to compensate for the identified image deficiencies (step 706). In step 708, a second exposure of the photosensitive surface is performed in accordance with the adjusted image data during a second pass.

Overlap of Exposure Zones with Attenuation

Figure 8:
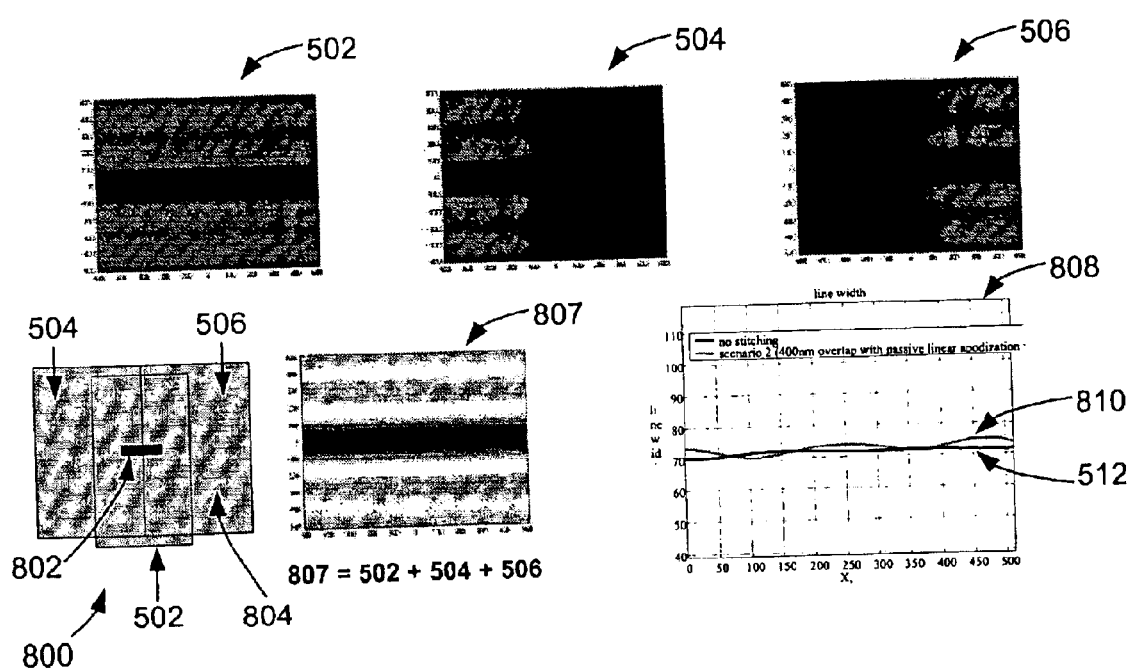
FIG. 8 is an illustration of an exemplary technique to compensate for stitching errors utilizing overlap of exposure zones with attenuation.

FIG. 8 provides an illustration of another exemplary technique 800 to compensate for the effects of stitching disturbances. The technique 800 utilizes overlap of exposure zones and provides attenuation of the aerial image and within the overlap region. In short, the technique 800 utilizes a small overlap of exposure zones to compensate for the stitching disturbance of the printed pattern occurring near the stitching line. The overlap area near the stitching line receives an extra dose due to the extra multiple exposures, and attenuation of the aerial image is performed to compensate for these extra multiple exposures. The attenuation can be performed either actively or passively.

Active attenuation is based on dynamically adjusting the states of the pixels of the SLM array to perform the attenuation in the overlap zone. This active attenuation can take into account the illumination mode, width, and geometry of the overlap and the specific pattern printed across the overlap zone, as well as other factors.

Passive attenuation, on the other hand, uses modifications of SLM related hardware to provide the attenuation. The methods to achieve passive attenuation include, but are not limited to, apodized aperture, out-of-focus/field stop, and prefabricated modifications of the SLM elements.

APODIZED APERTURE. An apodized aperture can be introduced either in front of the object or in an intermediate image plane. This aperture has a variable transmission near the edge of the SLM array, or its intermediate image, that ensures the attenuation of the aerial image. Apodization is preferably performed near the leading and trailing vertical edges to compensate for a spare exposure in the overlap zone. Formulas describing the variation of transmission can be dependent upon specific illumination conditions (to provide better stitching illumination conditions). The formulas can also be generic formulas, that work reasonably well for a wide range of illumination conditions (for example, linear variation of intensity transmission). These formulas are derived using techniques known in the art.

Apodization can be passive (use of apodized aperture), active (adjusting the pixels of the SLM array near the stitching line), or a combination of these two. Passive apodization can be performed either in the object plane or the (intermediate) image plane.

OUT-OF-FOCUS/FIELD STOP. Out-of-focus aperture/ field stop is an alternative to apodized aperture, where an aperture that is slightly out of focus can be used or a masking plate placed in front of the SLM.

PREFABRICATED MODIFICATIONS. Prefabricated modification of the SLM elements within the overlap zone is based on using an SLM array in which the pixels falling within the overlap zone are pre-modified in a way that ensures the desired attenuation of the aerial image.

An example of a prefabricated modification of an SLM element includes varying reflectivity of the micro-mirror surfaces within the overlap zone for SLM arrays, using tilting or pistoning the individual mirrors within the SLM array. The variation can be discrete (constant reflectivity within each mirror, but varying from mirror to mirror) or continuous. Varying reflectivity can be generalized for an SLM array using any modulation principle (and not utilizing micro-mirrors). For example, within the overlap zone, pixels of an SLM array that use variations of transmission can be pre-manufactured so that maximal transmission of their brightest state varies in a desired way.

Another example of a prefabricated modification of an SLM element includes a built-in modification of discrete states of the SLM elements, or pixels. This modification assumes that the discrete states (e.g., tilts of the tilting micro-mirrors) of the SLM elements within the overlap zone are modified or shifted, compared to the discrete states of other SLM elements. This built-in modification technique is another example of passive attenuation and can be applied to an SLM using any modulation principle.

FIG. 8 is an example of active attenuation, as noted above. Particularly FIG. 8 is an illustration of an exemplary technique utilizing overlap of exposure zones with attenuation of the aerial image, using an active attenuation approach. In FIG. 8, the exposures 502, 504, and 506, shown in FIG. 5, are re-analyzed applying an active attenuation approach. Here, a display 800 is formed by combining the exposures 502, 504, and 506. For purposes of illustration, the exposures 504 and 506 are overlapped by a width of 10 pixels to produce a feature 802 within an overlap zone 804. Within the overlap zone 804, a linear attenuation of the object plane field is implemented in accordance with one of the passive attenuation techniques, noted above. A resulting image 807 is produced by combining the exposures 502, 504, and 506, after utilizing the active attenuation. A graph 808 provides an illustration of improvements realized by a reduction in the line-width variations. Specifically, the graph 808 indicates that line width variations 810 associated with the line 512, shown in FIG. 5, can be reduced from the 25 nm (shown in FIG. 5) to less than 5 nm.

Figure 9:
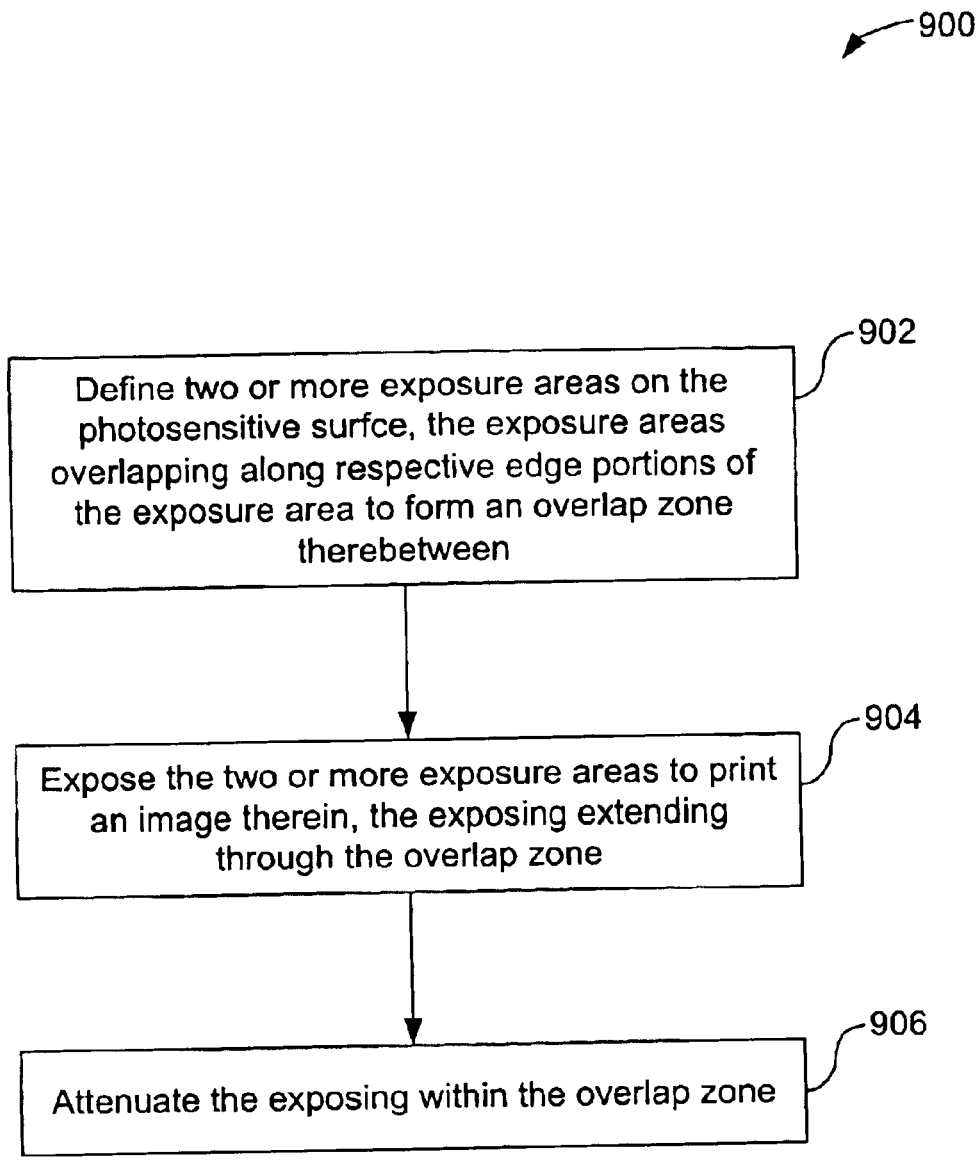
FIG. 9 is a flow diagram of an exemplary method of practicing the technique illustrated in FIG. 8.

FIG. 9 is a flow diagram of an exemplary method 900 of performing active attenuation of an aerial image within the overlap region. Using the method 900, two or more exposure areas on a photosensitive surface are defined (step 902). The exposure areas overlap along respective edge portions to form an overlap zone therebetween. In step 904, the two or more exposure areas are exposed to print an image therein, wherein the exposing extends through the overlap zone. Next, the exposing that occurs within the overlap zone is attenuated, as indicated in step 906.

Utilizing Overlap without Explicit Attenuation

Figure 10:
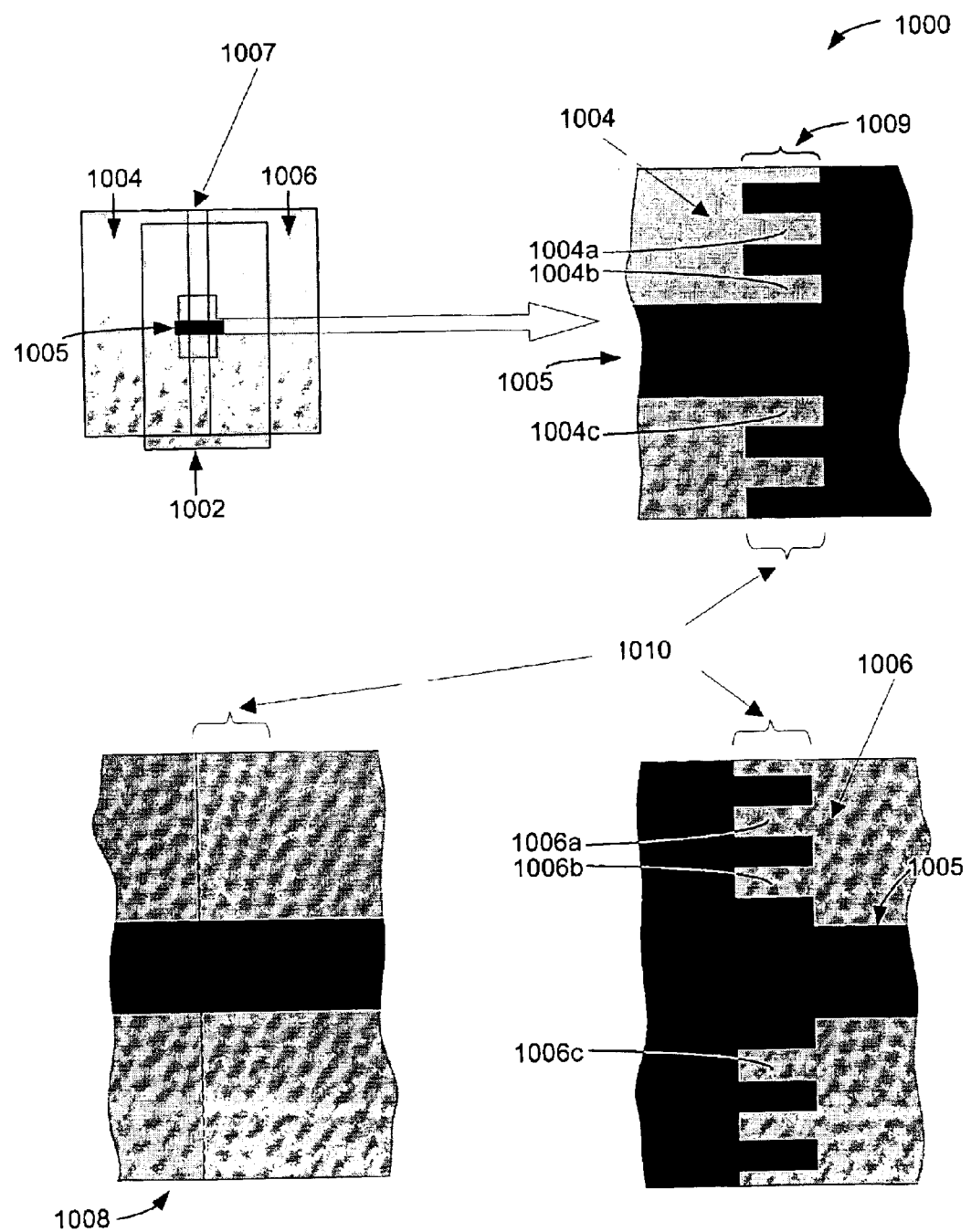
FIG. 10 is an illustration of a technique to compensate for stitching errors utilizing overlap without an explicit attenuation producing an oscillating type pattern.

FIG. 10 provides an illustration of an exemplary technique 1000 to compensate for stitching disturbances utilizing overlap without an explicit attenuation. The technique 1000 is just one exemplary approach utilizing overlap without an explicit attenuation. More specifically, the technique 1000 produces an oscillating stitching line along the stitching boundary. In other words, the overlap zone is used to create a stitching border that changes its direction in a zigzag pattern or some other fashion.

In the technique 1000, exposure zones are overlapped. And within the overlap zone, only one of the two overlapping pixels carries the pattern. The other overlapping pixel is turned off. A resulting printed pattern is thus distributed between two overlapping exposure zones in such a way that the effective border between the two adjacent exposure zones is, for example, a "shark teeth" line or any other rapidly oscillating line. Such oscillating lines represent a spatial averaging of the stitching disturbance and, subsequently, a reduction of its effect on the printed pattern.

The technique 1000 of FIG. 10 is just one example of an oscillating stitching line approach. In FIG. 10, overlapping exposure zones 1002, 1004, and 1006, are used to form a printed feature 1005 along a stitching zone 1007. In the technique 1000, however, selected pixels (within the pixels used to produce overlapping exposures 1002, 1004, and 1006), are activated to spatially average the energy associated with the stitching disturbance. This spatial averaging creates a zigzag pattern 1009. For example, within the exposure zone 1004, selected (overlapping) pixels, within overlapping pixel sets, are representative of zone portions 1004a, 1004b, and 1004c. These selected pixels are then energized such that the pattern used to form the feature 1005 is produced in one shot and only from pixels associated with the exposure 1004.

Similarly, selected overlapping pixels that produce exposure zone portions 1006a, 1006b, and 1006c, from the exposure 1006, are used to form another segment of the pattern. When the exposures 1004 and 1006 are combined, an exposure 1008 is formed having substantially reduced stitching artifacts within the overlap region 1010. Alternatively, the selected pixels within pixel sets used to form the overlapping exposures can be alternately turned on and off to produce some other pattern, such as a checkerboard pattern 1020 as indicated in FIG. 10A.

For example, the overlapping pixels can be distributed between the exposures in a checkerboard pattern with white (on) pixels belonging to one exposure and black (off) pixels belonging to another exposure. Since relatively higher spatial frequencies are used than in the case of the oscillating border (this spatial frequency can also vary across the overlap zone if the pattern is properly selected), better stitching can be produced.

Figure 10A:
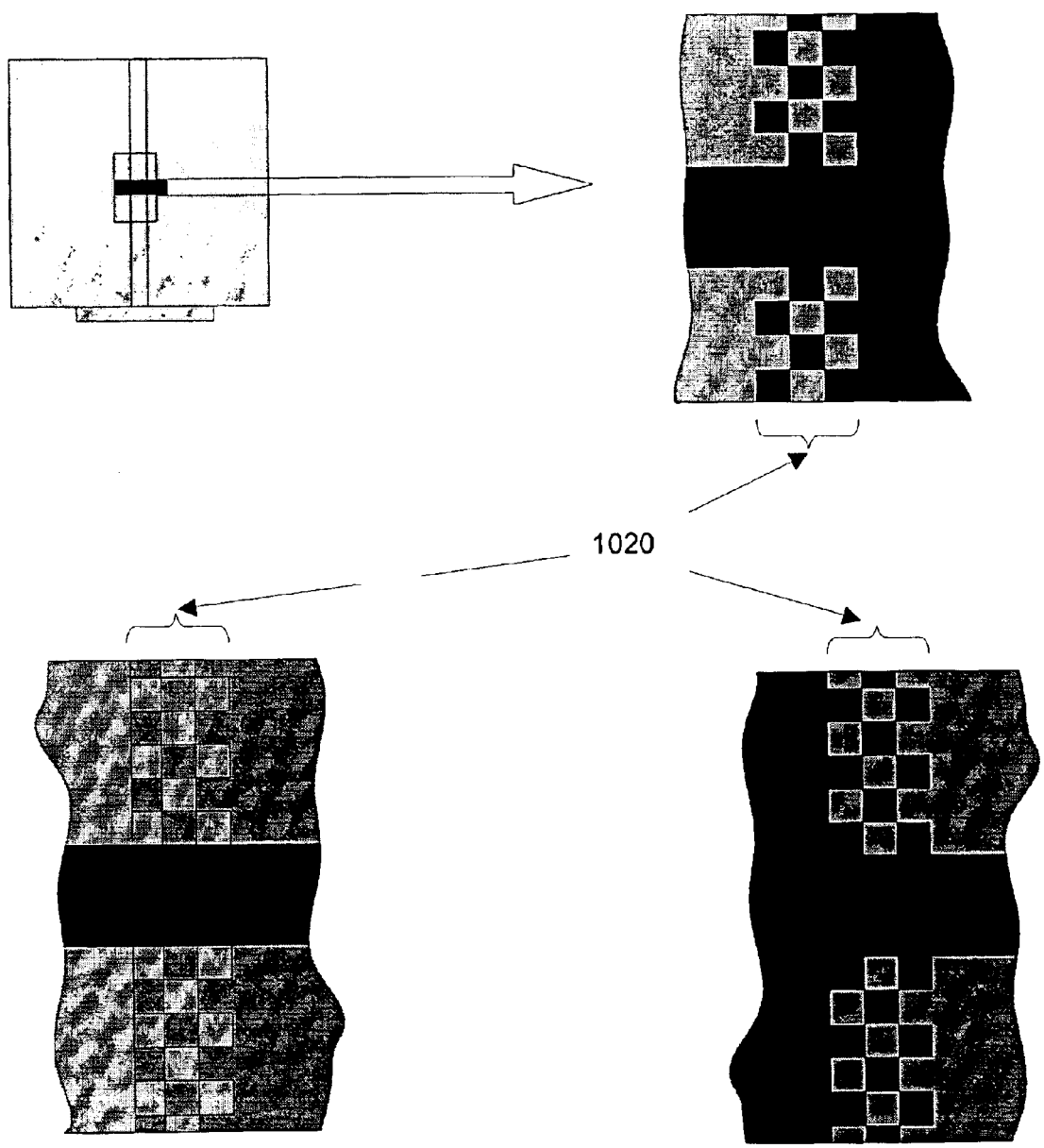
FIG. 10A is an illustration of the technique of FIG. 10 producing a checkerboard type pattern.

In FIGS. 10 and 10A, the exposure zones are overlapped, and within the overlap zone, only one of the two overlapping pixels carries the pattern. The other overlapping pixel is turned off. The printed pattern is thus distributed between two overlapping exposures, and the printed pattern is preferably distributed between these exposures with a relatively high spatial frequency. Further, the overlapping exposures need not necessarily form an oscillating connected border between two exposures.

Figure 11:
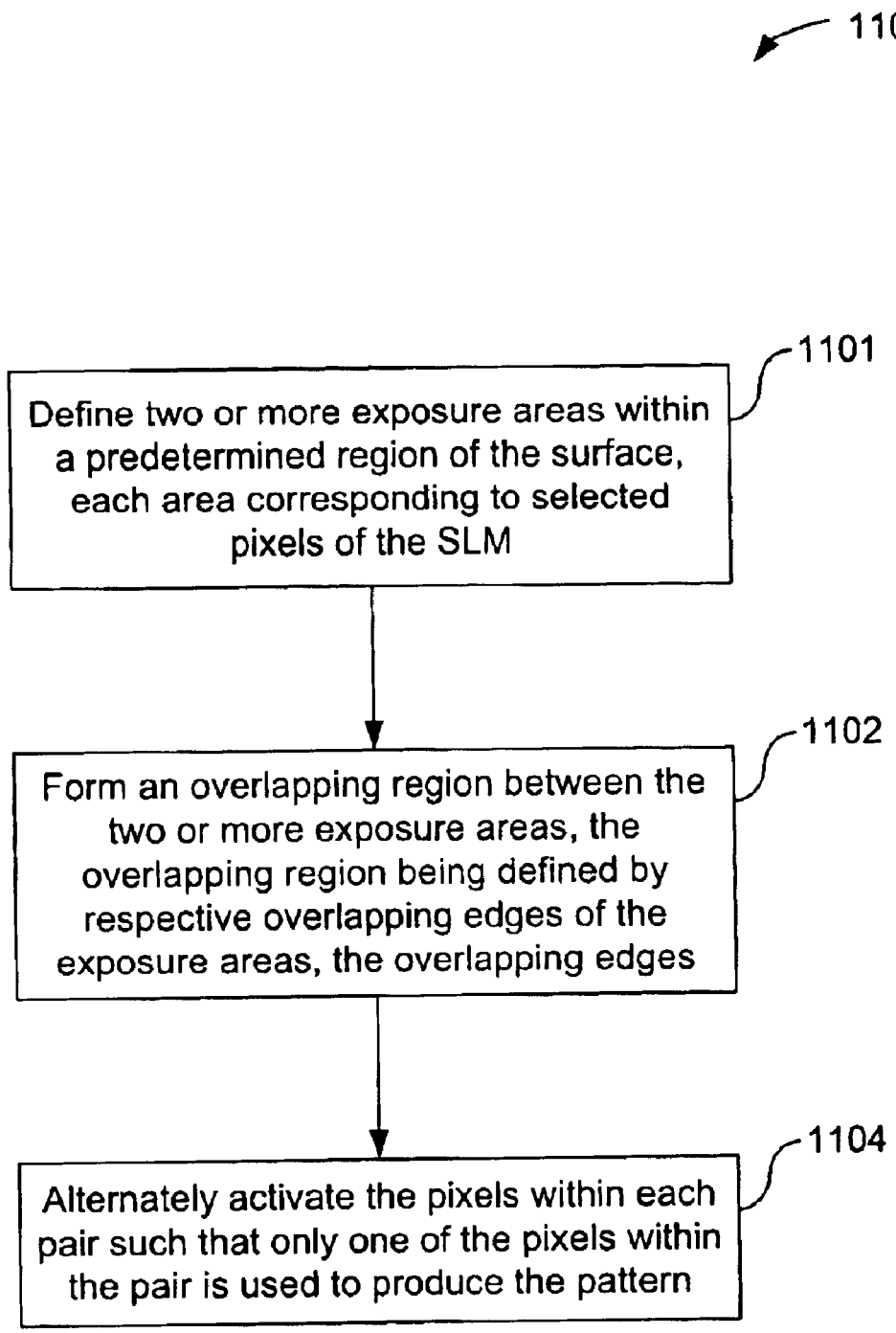
FIG. 11 is a flow diagram of an exemplary method of practicing the technique illustrated in FIG. 10.

FIG. 11 is a flow diagram of an exemplary method 1100 of performing the present invention as illustrated in FIG. 10. In FIG. 11, two or more exposure areas are defined within a predetermined region of a substrate surface. Each area corresponds to selected pixels of the SLM (step 1101). In step 1102, an overlapping region is formed between two or more exposure areas, the overlapping region being defined by respective overlapping edges of the exposure areas. The overlapping edges correspond to overlapping pairs of the selected pixels from each area. In step 1104, the pixels within each pair are alternately activated, such that only one of the pixels within the pair is used to produce the pattern.

The stitching disturbance can be compensated by properly selecting the width of an overlap (without attenuation). For any illumination mode, the butting (exposure with zero overlap) results in under-exposure along the stitching line (e.g., for a coherent illumination, the dose along the stitching line is 50% of its value in the absence of the stitching effect). On the other hand, overlap by a significant length $$\left(\text{several times exceeding} \left(\frac{\lambda}{(M*NA)}\right)\right)$$

without attenuation would result in a dose over-exposure along the stitching line. If the width of the overlap zone is properly selected between these two extreme values, an exact location of the stitching line can receive the exact dose, which would allow compensation of the disturbance near the stitching line.

Overlap with a field stop close to the image plane will also reduce the stitching/edge effects. The exposure zones are overlapped, and a field stop is placed in close proximity to the image plane so that this field stop blocks a part of the image in the overlap zone that is most affected by the edge effects (the outer part of the SLM image). The width of the exposure zone should be large enough $$\left( \gg \frac{\lambda}{(M*NA)} \right)$$

to ensure that the edge effects can be blocked by the field stop. Additionally, the pixels that are mostly blocked by the field stop can be modulated to provide an extra compensation of the edge effects remaining in the image that passes the field stop.

As a result, an image that reaches the image plane has substantially zero or very minimal edge effects in it, and stitching can be performed by butting the two images together.

One example of the overlap with a field stop is as follows: an isolated line crossing the stitching boundary is printed, and the pixels blocked by the field stop create a continuation of the image of the line on the field stop. If the width of the layer of blocked pixels is large enough $$\left(\text{much greater than } \frac{\lambda}{(M*NA)}\right),$$

the single exposure that creates an image of a semi-line will result in a semi-line with a sharp edge, because the edge-smearing effects are blocked by the field stop. If the second half of the line is similarly imaged, the stitching can be performed by butting the two images together.

Additional extraneous factors, noted below, will also affect the impact of a stitching disturbance.

SMEARING OF THE IMAGE. Smearing of the image due to the wafer motion during exposure is an additional phenomenon that will affect the impact of a stitching disturbance. The exposure mechanism in a maskless lithography tool may involve exposures by short laser pulses that are performed on a wafer that moves with a constant velocity. Such exposure mechanisms will result in smearing of the image in the direction of motion.

The duration of the laser pulse must be small enough for the smearing not to affect the printed pattern significantly. For typical scanning speeds and laser pulse durations, the effect of smearing should not exceed a small number of nanometers. This effect can be further compensated by laser pulse synchronization. At the same time, such smearing can be beneficial, as it will naturally reduce the stitching disturbance occurring near the stitching lines which are perpendicular to the direction of scan.

JITTER OF THE LASER PULSES. Laser pulse jitter is another factor that will affect the impact of a stitching disturbance. In the exposure scenario described in the previous paragraph, the laser pulse may be arriving too early or too late (laser jitter phenomenon). The characteristic magnitude of the laser pulse jitter is 3 σ=10 nanoseconds (nsec). As a result of these delays or advances, the position of the exposure on the wafer resulting from this laser pulse may be shifted in the direction of the wafer scan or in the opposite direction. These small shifts can lead to spatial misalignment of the stitched exposures, and this misalignment (along with the misalignment of exposures occurring due to other reasons) contributes to the stitching disturbance. The techniques to compensate for stitching illustrated in the present application, however, can be used to compensate the effects of laser pulse jitter.

Figure 12:
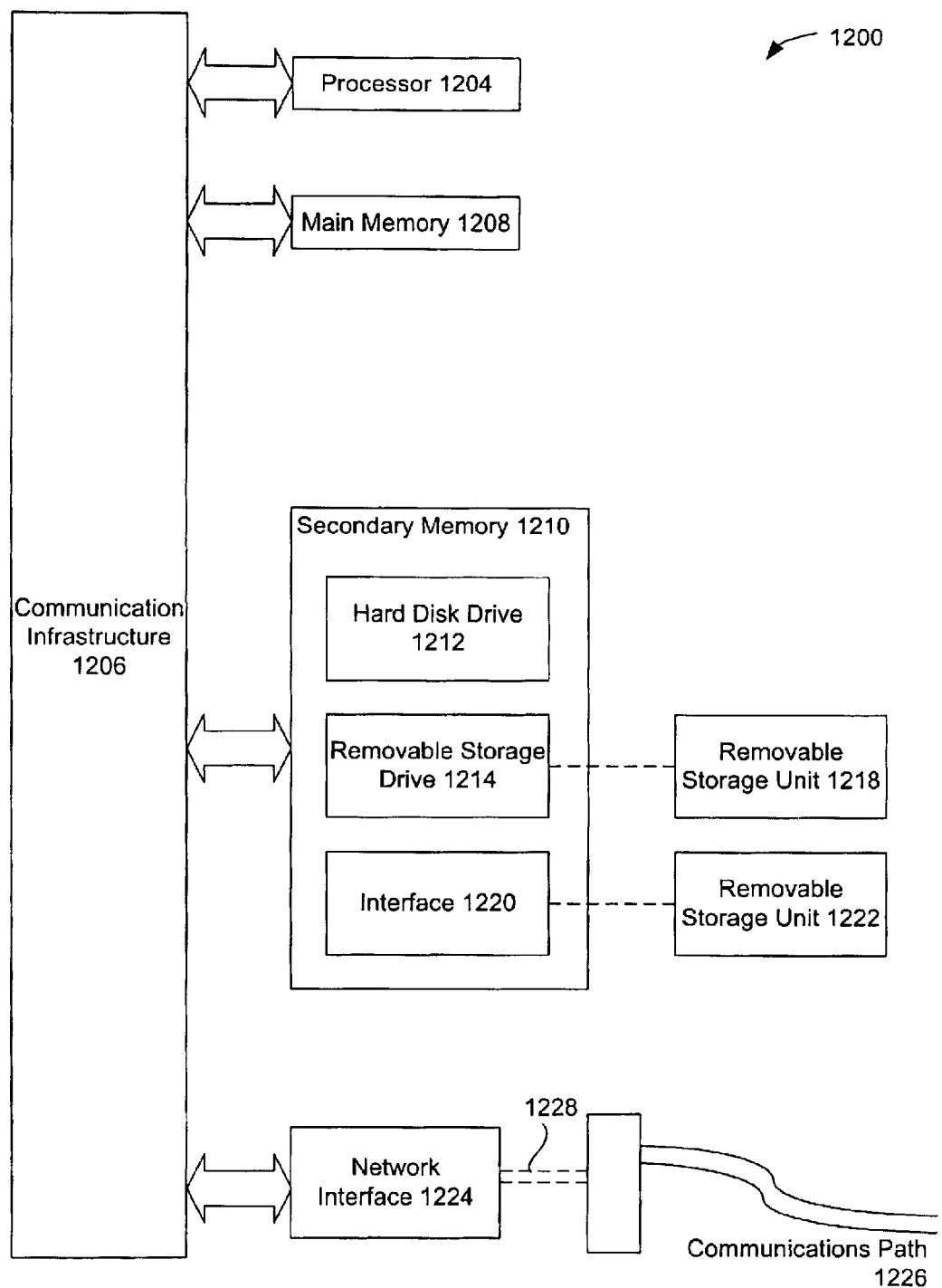
FIG. 12 is a block diagram of an exemplary computer system on which the present invention can be practiced.

As stated above, the present invention can be implemented in hardware, or as a combination of software and hardware. Consequently, the invention may be implemented in the environment of a computer system or other processing system. An example of such a computer system 1200 is shown in FIG. 12.

The computer system 1200 includes one or more processors, such as a processor 1204. The processor 1204 can be a special purpose or a general purpose digital signal processor. The processor 1204 is connected to a communication infrastructure 1206 (for example, a bus or network). Various software implementations are described in terms of this exemplary computer system. After reading this description, it will become apparent to a person skilled in the relevant art how to implement the invention using other computer systems and/or computer architectures.

The computer system 1200 also includes a main memory 1208, preferably random access memory (RAM), and may also include a secondary memory 1210. The secondary memory 1210 may include, for example, a hard disk drive 1212 and/or a removable storage drive 1214, representing a floppy disk drive, a magnetic tape drive, an optical disk drive, etc. The removable storage drive 1214 reads from and/or writes to a removable storage unit 1218 in a well known manner. The removable storage unit 1218, represents a floppy disk, magnetic tape, optical disk, etc. which is read by and written to by removable storage drive 1214. As will be appreciated, the removable storage unit 1218 includes a computer usable storage medium having stored therein computer software and/or data.

In alternative implementations, the secondary memory 1210 may include other similar means for allowing computer programs or other instructions to be loaded into the computer system 1200. Such means may include, for example, a removable storage unit 1222 and an interface 1220. Examples of such means may include a program cartridge and cartridge interface (such as that found in video game devices), a removable memory chip (such as an EPROM, or PROM) and associated socket, and the other removable storage units 1222 and the interfaces 1220 which allow software and data to be transferred from the removable storage unit 1222 to the computer system 1200.

The computer system 1200 may also include a communications interface 1224. The communications interface 1224 allows software and data to be transferred between the computer system 1200 and external devices. Examples of the communications interface 1224 may include a modem, a network interface (such as an Ethernet card), a communications port, a PCMCIA slot and card, etc. Software and data transferred via the communications interface 1224 are in the form of signals 1228 which may be electronic, electromagnetic, optical or other signals capable of being received by the communications interface 1224. These signals 1228 are provided to the communications interface 1224 via a communications path 1226. The communications path 1226 carries the signals 1228 and may be implemented using wire or cable, fiber optics, a phone line, a cellular phone link, an RF link and other communications channels.

In the present application, the terms "computer readable medium" and "computer usable medium" are used to generally refer to media such as the removable storage drive 1214, a hard disk installed in the hard disk drive 1212, and the signals 1228. These computer program products are means for providing software to the computer system 1200.

Computer programs (also called computer control logic) are stored in the main memory 1208 and/or the secondary memory 1210. Computer programs may also be received via the communications interface 1224. Such computer programs, when executed, enable the computer system 1200 to implement the present invention as discussed herein.

In particular, the computer programs, when executed, enable the processor 1204 to implement the processes of the present invention. Accordingly, such computer programs represent controllers of the computer system 1200. By way of example, in the embodiments of the invention, the processes/methods performed by signal processing blocks of encoders and/or decoders can be performed by computer control logic. Where the invention is implemented using software, the software may be stored in a computer program product and loaded into the computer system 1200 using the removable storage drive 1214, the hard drive 1212 or the communications interface 1224.

CONCLUSION

Provided herein are several unique approaches to compensating for the effects of stitching errors that can occur near the stitching line in maskless lithography patterns. The approaches include (a) techniques not utilizing overlap of exposure areas, (b) techniques using overlap and attenuation, and (c) techniques using overlap without explicit attenuation. These approaches, either alone or in combination, significantly reduce the stitching disturbances, optical anomalies, and other effects that might otherwise be introduced into lithography patterns printed on photosensitive surfaces.

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed.

Any such alternate boundaries are thus within the scope and spirit of the claimed invention. One skilled in the art will recognize that these functional building blocks can be implemented by analog and/or digital circuits, discrete components, application-specific integrated circuits, firmware, processor executing appropriate software, and the like, or any combination thereof. Thus, the breadth and scope of the present invention should not be limited by any of the above-described exemplary embodiments, but should be defined only in accordance with the following claims and their equivalents.

The foregoing description of the specific embodiments will so fully reveal the general nature of the invention that others can, by applying knowledge within the skill of the art (including the contents of the references cited herein), readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance presented herein, in combination of one of ordinary skill in the art.

What is claimed is:

1. A method to compensate for errors in a pattern to be printed on a photosensitive surface using a spatial light modulator (SLM), comprising:

defining two or more exposure areas on the photosensitive surface, the exposure areas overlapping along respective edge portions of the exposure areas to form an overlap zone therebetween;

determining attenuation of at least one of a predicted aerial image and a corresponding resist image:

exposing the two or more exposure areas to print an image therein, the exposing extending through the overlap zone; and implementing the determined attenuation during the exposing within the overlap zone.

2. The method of claim 1, wherein the exposing includes applying a laser dose.

3. The method of claim 1, wherein each exposure area corresponds to one illumination source pulse.

4. The method of claim 1, wherein the attenuating step includes active attenuation.

5. The method of claim 4, wherein the active attenuation step includes dynamically adjusting pixels within the SLM to compensate for deficiencies within the image.

6. The method of claim 1, wherein the attenuating step includes passive attenuation.

7. The method of claim 6, wherein the passive attenuation step includes use of at least one from the group including apodized apertures, out of focus aperture/field stop, and pre-fabricated modification of SLM pixels.

8. The method of claim 1, wherein the attenuating step is a function of at least one from the group including illumination mode, dimensions of the overlap zone, and dimensions of the image.

9. An apparatus configured to compensate for errors in a pattern to be printed on a photosensitive surface using a spatial light modulator (SLM), the apparatus comprising:

means for defining two or more exposure areas on the photosensitive surface, the exposure areas overlapping along respective edge portions of the exposure areas to form an overlap zone therebetween;

means for determining attenuation of at least one of a predicted aerial image and a corresponding resist image;

means for exposing the two or more exposure areas to print an image therein, the exposing extending through the overlap zone; and means for implementing the determined attenuation during the exposing within the overlap zone.

10. The apparatus of claim 9, wherein the means for exposing is configured to apply a laser dose.

11. The apparatus of claim 9, wherein each area corresponds to one illumination source pulse.

12. The apparatus of claim 9, wherein the means for attenuating is configured to perform active attenuation.

13. The apparatus of claim 9, wherein the active attenuation includes dynamically adjusting pixels within the SLM to compensate for deficiencies within the image.

14. The apparatus of claim 9, wherein the means for attenuating is configured to perform passive attenuation.

15. A computer readable medium carrying one or more sequences of one or more instructions for execution by one or more processors to perform a method to compensate for errors in a pattern to be printed on a photosensitive surface using a spatial light modulator (SLM), the instructions when executed by the one or more processors, cause the one or more processors to perform the steps of:

defining two or more exposure areas on the photosensitive surface, the exposure areas overlapping along respective edge portions of the exposure areas to form an overlap zone therebetween;

determining attenuation of at least one of a predicted aerial image and a corresponding resist image;

exposing the two or more exposure areas to print an image, the exposing extending through the overlap zone; and implementing the determined attenuation during the exposing within the overlap zone.

* * * * *